United States Patent [19]
Yamanaka

[11] Patent Number: 5,170,444
[45] Date of Patent: Dec. 8, 1992

[54] METHOD OF INSPECTING JOINTED PORTION

[75] Inventor: Kazuyuki Yamanaka, Fujisawa, Japan

[73] Assignee: Kabushiki Kaisha Toshiba, Kawasaki, Japan

[21] Appl. No.: 718,428

[22] Filed: Jun. 20, 1991

[30] Foreign Application Priority Data

Jun. 22, 1990 [JP] Japan .................................. 2-164676

[51] Int. Cl.$^5$ ........................ G06K 9/44; H04N 7/00; H04N 7/18
[52] U.S. Cl. .................... 382/55; 358/101; 358/106
[58] Field of Search ................ 382/55; 358/101, 106; 340/728

[56] References Cited

U.S. PATENT DOCUMENTS

| | | | |
|---|---|---|---|
| 3,846,754 | 11/1974 | Oka et al. | 382/55 |
| 3,889,053 | 6/1975 | Lloyd et al. | 358/106 |
| 4,065,212 | 12/1977 | Belleson | 356/167 |
| 4,809,341 | 2/1989 | Matsui et al. | 382/8 |
| 4,949,390 | 8/1990 | Overson et al. | 382/55 |
| 5,050,229 | 9/1991 | Barski et al. | 382/55 |

FOREIGN PATENT DOCUMENTS 61-128143  6/1986  Japan .
61-132843  6/1986  Japan .
1-251630  10/1989  Japan .

OTHER PUBLICATIONS

"A sequential algorithm for shrinking binary pictures"; Yokoi et al.; System Computer Controls; vol. 10, No. 4; 1979; pp. 69–75.

Primary Examiner—John K. Peng
Attorney, Agent, or Firm—Foley & Lardner

[57] ABSTRACT

A bonded portion of a bonding wire jointed to a semiconductor chip, for example, is inspected by utilizing a image pickup device by a method which comprises the steps of image picking up a bonded portion plastically deformed, extracting the bonded portion as a mass of pixels each having predetermined brightness from an image picked up by the image pickup device, decreasing a size of the mass of the extracted pixels by carrying out, by at least one step, logical brightness conversion, i.e. filtering, operation on the basis of the relationship in brightness of one of the pixels with respect to other pixels which surround the one of the pixels, and repeating the brightness conversion operation till the mass of the extracted pixels is extinguished. A size of the bonded portion is detected in dependency on the number of times of the brightness conversion operations carried out till the mass of the pixels is extinguished to thereby evaluate the quality of the bonded portion. A center of the mass of the pixels is simultaneously detected as a center of the bonded portion just before a time when the mass thereof is exinguished to thereby inspect a position of the bonded portion.

14 Claims, 5 Drawing Sheets $_9C_1+_9C_2+_9C_3+_9C_4$ $$_9C_1 + {_9C_2} + {_9C_3} + {_9C_4}$$

METHOD OF INSPECTING JOINTED PORTION

BACKGROUND OF THE INVENTION

The present invention relates to a method of inspecting a bonded or jointed portion particularly of a bonding wire in a case where an end portion of the bonding wire is plastically deformed and the deformed end portion is bonded to an electrode of a semiconductor chip during a manufacturing process of a semiconductor device, for example.

In a prior art, when a semiconductor device is manufactured, one end of a bonding wire is bonded to a surface of a bonding pad (electrode) of the semiconductor chip and the other end of the bonding wire, as an external terminal, is bonded to an inner lead of a lead frame. In this manufacturing process, the one end of the bonding wire is plastically deformed by means of melting to form a bonding ball as a bonding portion and the thus formed bonding ball is bonded to the surface to the bonding pad by pressing the same.

In such bonding process, it is necessary to inspect the size and the position of the bonding ball to thereby evaluate the quality as the bonded portion. However, in the conventional technology, such inspection is carried out by visually observing the outer appearance of the bonded portion by utilizing a stereo-microscope. Such visual observation involves defects or problems such as observation mistakes and difference of evaluation of the viewers. This inspection method further lacks in the real-time performance from the bonding time to the inspection time. In order to obviate these defects or problems, the provision of an exact automatic inspection method has been highly required.

Further in the known art, to solve the above problem, there is provided a method in which the bonded portion of the bonding ball is observed as an image by an image pickup device and an area of the bonded portion in the image is measured, the measured value being then compared with a reference value to thereby evaluate the quality of the bonded portion.

This method, however, also involves a problem of the extinction of the bonded portion from the other portion in the image. Such extinction generally requires a complicated pretreatment, though being dependent on the quality of the image, resulting in the lowering of the inspection speed and the increasing of the cost of an inspection device to be used. Furthermore, in this method, in order to discriminate the bonded portion from the other portion in the image, it is required to carry out an image pickup procedure with relatively high magnitude so that the bonded portion is imaged with more than 50 pixels. In case of the pixels of less than 50, it is extremely hard to discriminate the bonded portion from the other portion in the image.

Furthermore, in the inspection of the size of the bonding ball, when the bonding ball has the image picked up from the upper portion thereof, a part of the image of the bonding ball is concealed by the bonding wire, which results in the complicated and difficult preprocessing for specifying the outer contour of the bonding ball, as well as specifying the portion concealed by the bonding wire.

Moreover, in addition to the above problem, in a case where the contour of the image of the bonding ball is not clear and is not shown with a smooth line, the area of the bonding ball is measured differently to a great extent, by the selection of the contour line, and particularly, with respect to the image picked up with a low magnitude, the measuring, i.e. inspection, performance will be degraded. The difficulty of the specifying the contour line results in the difficulty of the exact positioning of the bonded portion by the inspection of the central portion thereof.

SUMMARY OF THE INVENTION

An object of the present invention is to substantially eliminate defects or drawbacks encountered in the prior art and to provide a method of inspecting a jointed or bonded portion capable of easily evaluating the quality of a bonded portion and the detecting the position thereof by carrying out an image pickup operation with relatively low magnitude by simple sequential processing with high performance for a short inspection time.

This and other objects can be achieved according to the present invention by, in one aspect, providing a method of inspecting a joint portion of one member which is plastically deformed and jointed to another member by utilizing an image pickup device, characterized by comprising the steps of:

image picking up the jointed portion plastically deformed;

extracting the jointed portion as a mass of pixels each having predetermined brightness from an image picked up by the image pickup device;

decreasing a size of the mass of the extracted pixels by carrying out, by at least one step, logical brightness conversion operation on the basis of the brightness relationship of one of the pixels with respect to other pixels which surround the one of the pixels;

repeating the brightness conversion operation till the mass of the extracted pixels is extinguished; and detecting a size of the jointed portion in dependency on the number of times of the brightness conversion operations carried out till the mass of the pixels is extinguished to thereby evaluate the quality of the jointed portion.

In another aspect, there is provided a method of inspecting a joint portion of one member which is plastically deformed and jointed to another member by utilizing an image pickup device, comprising the steps of:

image picking up the jointed portion plastically deformed;

extracting the jointed portion as a mass of pixels each having predetermined brightness from an image picked up by the image pickup device;

decreasing a size of the mass of the extracted pixels by carrying out, by at least one step, logical brightness conversion operation on the basis of the brightness relationship of one of the pixels with respect to other pixels which surround the one of the pixels;

repeating the brightness conversion operation till the mass of the extracted pixels is extinguished; and detecting a center of the mass of the pixels as a center of the jointed portion just before a time when the mass thereof has been extinguished to thereby inspect a position of the jointed portion.

According to the present invention, the evaluation of the quality of the jointed portion and the position thereof can be both simultaneously carried out.

Furthermore, in both the aspects, the method includes a step of temporarily increasing the size of the mass of the pixels before the decreasing step of the size the mass of the pixels by a reverse logical brightness conversion operation to that of the decreasing step.

According to the present invention of the characters described above, the size of the jointed portion can be inspected in accordance with the number of times of logical brightness conversion operations carried out until the mass of the extracted pixels is extinguished, without specifying the contour of the image of the jointed portion by utilizing the image pickup device. Accordingly, the size of the jointed portion and the quality of the jointed portion can be surely inspected by the image pickup operation with relatively low magnitude without effecting a complicated preprocessing.

Furthermore, the position of the jointed portion can be also easily inspected substantially simultaneously in dependency of the mass of the pixels which gradually decreases in accordance with the repeated brightness conversion operations.

In addition, a portion of the image having a locally erroneous brightness due to noise, for example, can be corrected by temporarily increasing the size of the mass of the pixels before the decreasing step. In this case, the temporarily increasing the size of the mass of the pixels can be amended by considering the extra number of times of the brightness conversion operations.

BRIEF DESCRIPTION OF THE DRAWINGS

In the accompanying drawings:

FIG. 6 is a view similar to that of FIG. 1, but shows a case in which the brightness is erroneously represented due to noise or the like;

DESCRIPTION OF THE PREFERRED EMBODIMENT

In advance of the detailed disclosure of the present invention, the conventional technology of the inspection method will be first described with reference to FIGS. 8 to 10 for a better understanding of the present invention.

Figure 8:
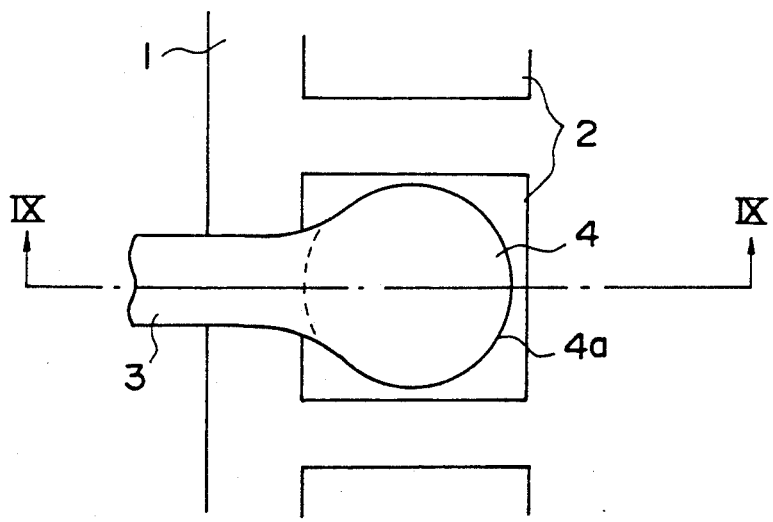
FIG. 8 is a plan view of a bonding wire which is bonded to a semiconductor chip, for example.
Figure 9:
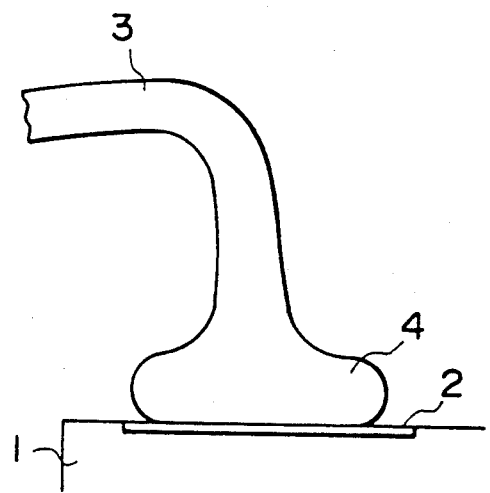
FIG. 9 is a sectional view taken along the line IX—IX of FIG. 8.

Referring to FIGS. 8 and 9, when a semiconductor device is manufactured, one end of a bonding wire 3 is bonded to a surface of a bonding pad (electrode) 2 of the semiconductor chip 1 and the other end of the bonding wire 3, as an external terminal, is bonded to an inner lead of a lead frame. In this manufacturing process, the one end of the bonding wire 3 is plastically deformed by means of melting to form a bonding ball 4 as a bonding portion and the thus formed bonding ball 4 is bonded to the surface of the bonding pad 2 by pressing the same.

In such a bonding process, it is necessary to inspect the size and the position of the bonding ball 4 to thereby evaluate the defectiveness or quality as the bonding portion. However, the conventional technology has the problems described hereinbefore.

Further in the known art, to solve the above problems, there is provided a method in which the bonded portion of the bonding ball 4 is observed as an image by an image pickup device and an area of the bonded portion in the image is measured, the measured value being then compared with a reference value thereby to evaluate the defectiveness or quality of the bonded portion.

This method, however, also involves the problem described hereinbefore.

Furthermore, as shown in FIGS. 8 and 9, in the inspection of the size of the bonding ball 4 as the bonding portion, when the bonding ball 4 is image picked up from the upper portion thereof, a part of the image of the bonding ball 4 is concealed by the bonding wire 3, which results in complicated and difficult preprocessing for specifying the outer contour of the bonding ball 4, as well as specifying the portion concealed by the bonding wire 3.

Figure 10:
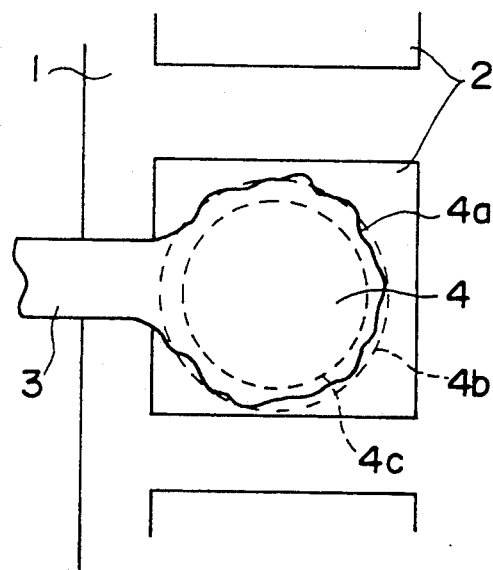
FIG. 10 is a plan view showing a condition of an image of a bonding ball of the bonding wire having an irregular contour.

Moreover, as shown in FIG. 10, in addition to the above problem, in the case where the contour 4a of the image of the bonding ball 4 is not clear and is not shown with a smooth line, the area of the bonding ball 4 is measured differently to a great extent by the selection of the contour lines. Namely, referring to FIG. 10, the area largely differs by selecting either one of the contour lines 4b or 4c, and particularly, with respect to the image picked up with low magnitude, the measuring, i.e. inspection, performance will be degraded. The difficulty of the specifying the contour line will result in a difficulty of the exact positioning of the bonded portion by the inspection of the central portion thereof.

The embodiment of the present invention conceived to solve or substantially eliminate the defects or problems encountered in the prior art described hereinabove will be described hereunder with reference to FIGS. 1 to 7.

The embodiment is for the inspection of the size and the position of the bonding ball 4 as a bonding portion to be inspected shown in FIGS. 8 and 9.

Figure 1:
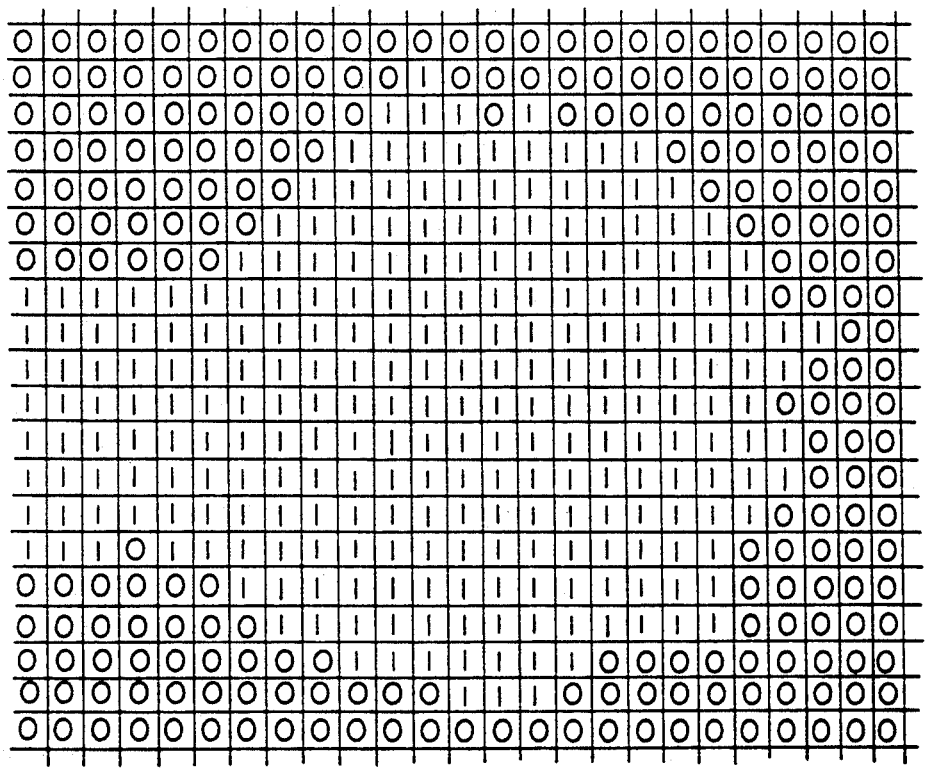
FIG. 1 is a view showing an image extracted as a mass of pixels having predetermined brightness of an image picked up portion.

According to the present invention, the bonding ball 4, shown in FIG. 8 or 9, is first image picked up as a portion to be bonded and the bonding ball 4 is extracted as a mass of pixels, each having a predetermined brightness, from the thus picked up image. The image of FIG. 1 is obtained by binarizing the mass of pixels, or distinguishing a portion having a predetermined brightness [1] of the bonding ball 4 and the bonding wire 3 bonded thereto from the other portion having a brightness [0]. In FIG. 1, checkers represent quantized grids. The image pickup operation is performed with a relatively low magnitude.

A brightness conversion operation, so-called "a logical filtering", to be effected to the image of FIG. 1 will be explained hereunder.

This operation includes a step in which, with respect to the binarized image, in combination of brightnesses ([1] or [0]) of nine pixels consisting of a certain one pixel and other eight pixels surrounding the one pixel, a new brightness of the central one pixel is determined and such step is then performed to the whole pixels.

The determination, i.e. conversion, of the brightness of the central pixel due to the combination of these nine pixels is performed on the basis of a table prepared preliminarily independently as shown in FIG. 2.

Figure 2A:
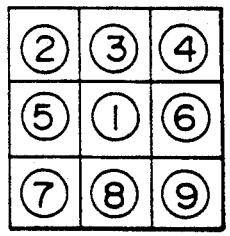
FIGS. 2A, 2B and 2C, represents table to be utilized for a brightness conversion operation for decreasing the size of the mass of the pixels.
Figures 2B, 2C:
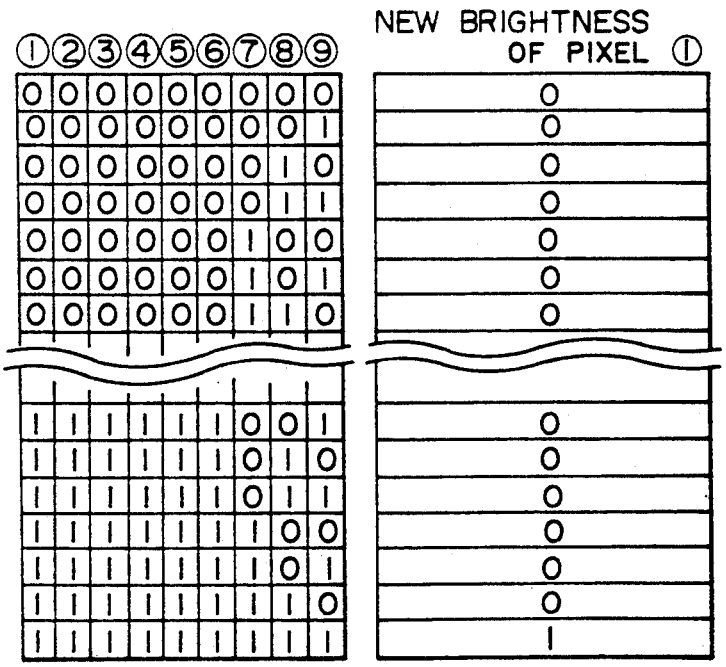

For example, when a new brightness of the pixel ①ˆ shown in FIG. 2A is determined, the determination of the brightness of the pixel ① is performed in combination of the pixel ① and the other eight pixels ② to ⑨ surrounding the pixel ①. For this purpose, a table such as shown in FIG. 2B is preliminarily prepared. The table of FIG. 2B represents a fact that, in the total combinations of the numbers 512 of these pixels ① to ⑨ (i.e. $512=2^9$), when the brightnesses of these pixels are all values of [1], a new brightness of the pixel ① is made to [1] and, on the other hand, when the pixels include even one pixel having a brightness [0], the new brightness of the pixel ① is made to [0]. This operation is repeated, for the image shown in FIG. 1, to determine and then convert the new brightnesses of the respective pixels by shifting a $3\times3$ pixel area with respect to each one pixel so that each of the whole pixels is in accordance with the pixel ① positioned at the central portion as shown in FIG. 2A. According to these repeated operations, an image shown in FIG. 3 will be obtained, in which, the brightness [0] is omitted.

Figure 3:
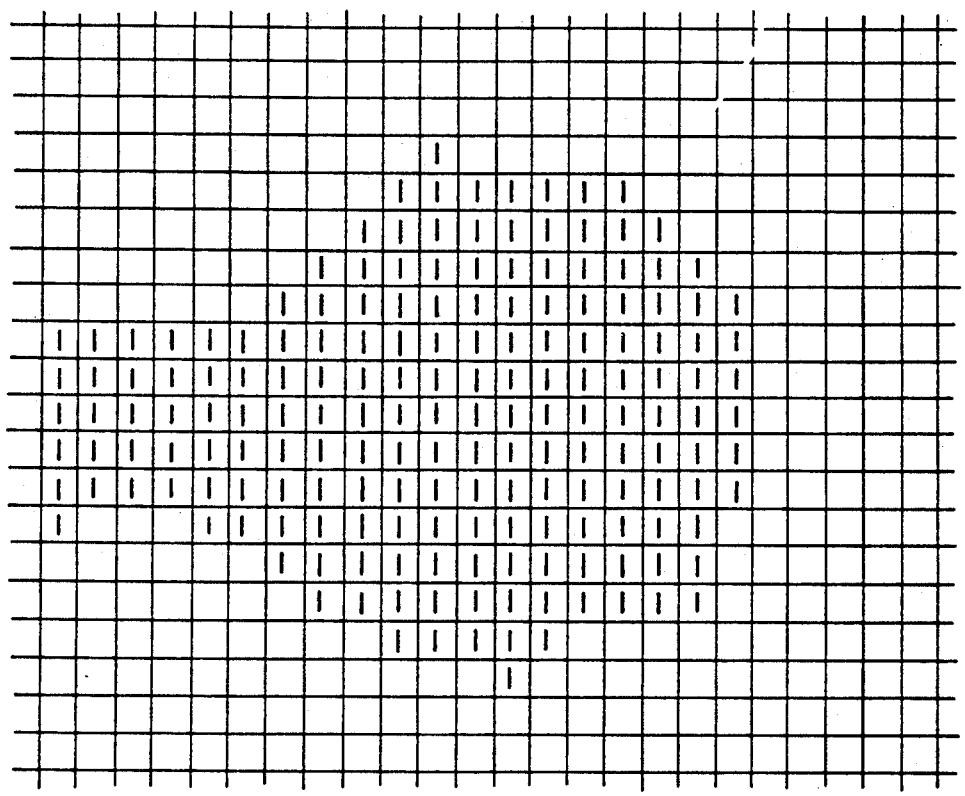
FIG. 3 is a view of an image after the brightness conversion operation is carried out as to the image shown in FIG. 1 in dependency on the table of FIGS. 2A, 2B and 2C.
Figure 4:
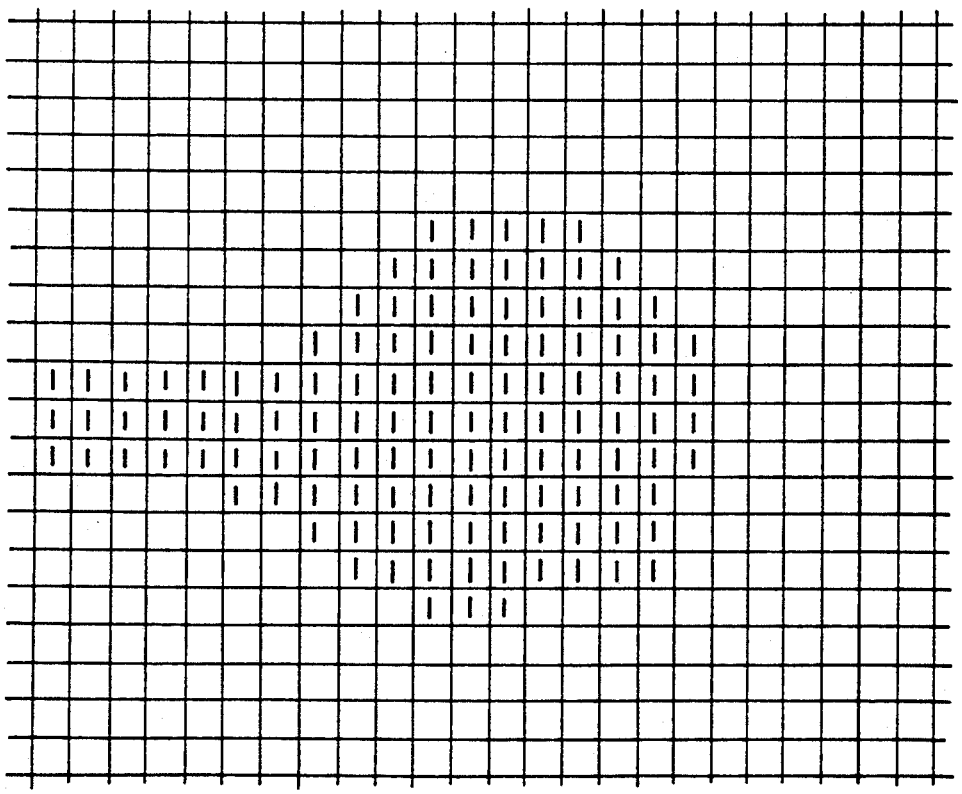
FIG. 4 is a view of an image after the brightness conversion operation is carried out as to the image shown in FIG. 3 in dependency on the table of FIGS. 2A, 2B and 2C.

When such brightness conversion operation is performed with respect to the image of FIG. 3 by one further stage, an image such as shown in FIG. 4 will be obtained. When this brightness conversion operation is repeated subsequently, an image corresponding to the bonding ball 4 having the brightness [1] is extinguished in dependency on the number of times of the "logical filtering" operations in accordance with the size of the bonding ball 4 without being influenced with a portion corresponding to the bonding wire 3 shown in the original image of FIG. 1 and the irregularity of the contour 4a of the bonding ball 4.

Figure 5:
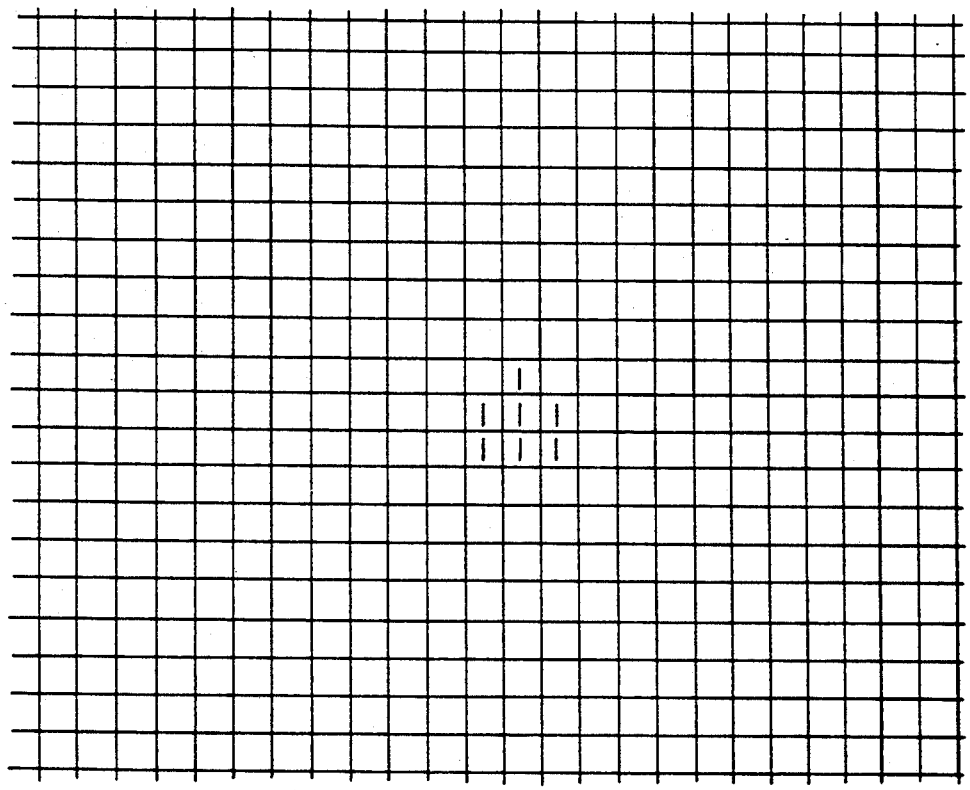
FIG. 5 is a view of an image after four brightness conversion operations have been carried out as to the image shown in FIG. 4 in dependency on the table of FIGS. 2A, 2B and 2C.

Namely, when a further four brightness conversion operations are performed with respect to the image shown in FIG. 4, an image shown in FIG. 5 will be obtained, and when further one brightness conversion operation is performed with respect to the image of FIG. 5, the image of the bonding ball 4 having the brightness [1] is extinguished.

As can be understood from the above disclosure, the number of times of the brightness conversion operations constitutes the criterion for representing the size of the bonding ball 4, i.e. bonding portion of the bonding wire 3. Accordingly, the defectiveness or quality of the bonded portion will be evaluated by preliminarily setting allowable range (number of times) of these brightness conversion operations. In other words, supposing that the reference number of stages or steps of the operation including the allowable minimum number of stages and the allowable maximum number of stages is preliminarily determined, the bonded portion is evaluated to be "good (not defective)" when the image having the brightness [1] is extinguished within the reference number of operation times, and also evaluated to be "bad (defective)" when not extinguished.

Figure 6:
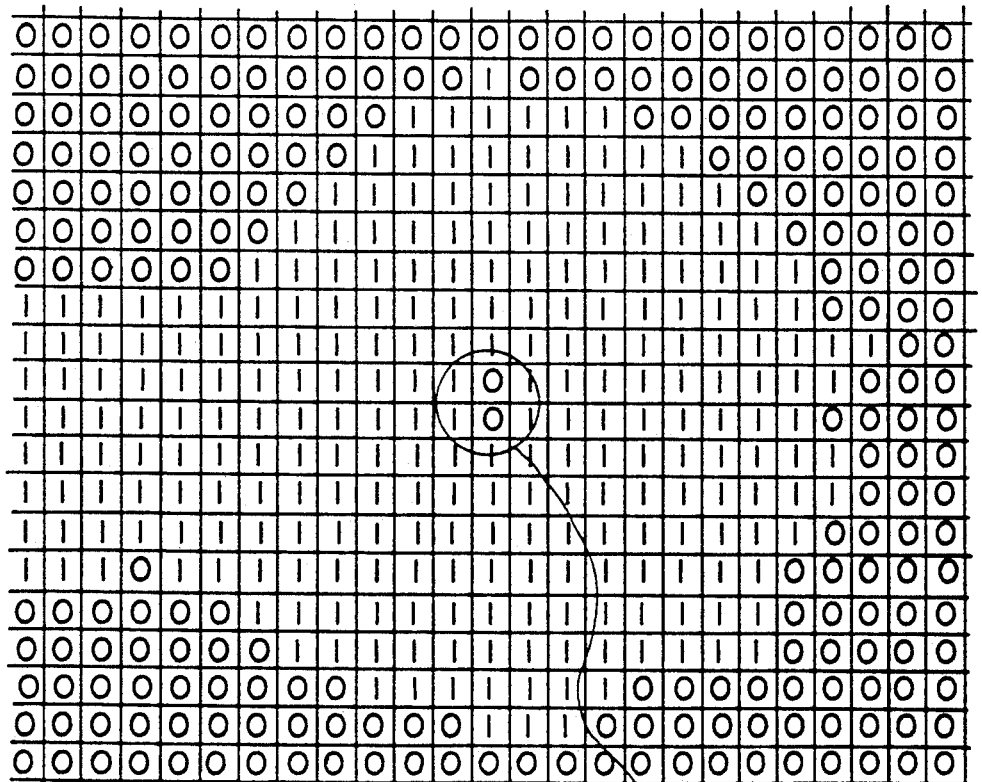

Furthermore, there may be a case, as shown in FIG. 6, wherein area having the brightness [0] is generated within an image area having the brightness [1] extracted from the original image due to noise, for example.

In such a case, if the brightness conversion operation is repeated subsequently, the area having the brightness [0] due to the noise is gradually enlarged, and in comparison with the image having no area of brightness [0] as essentially shown in FIG. 1, the image area of the brightness [1] of the bonding ball 4, i.e. bonded portion, may be extinguished by a lesser number of times of the brightness conversion operations, resulting in erroneous evaluation of the quality of the bonded portion to be defective.

Figure 7A:
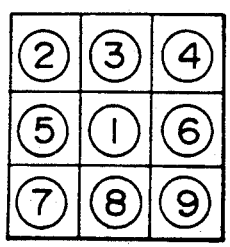
FIGS. 7A, 7B and 7C are views of tables utilized for carrying out a reverse brightness conversion operation for temporarily increasing the size of the mass of the pixels.
Figures 7B, 7C:
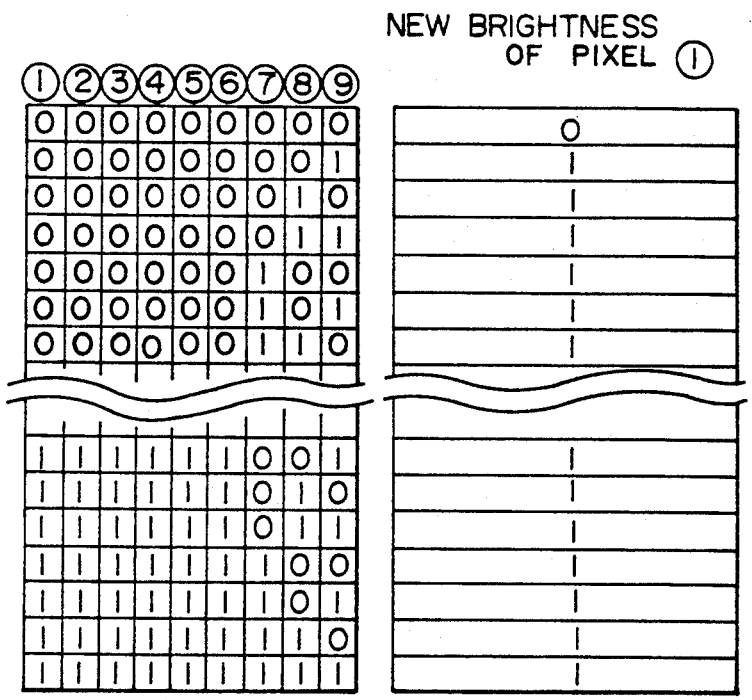

In order to obviate such evaluation error, and other tables such as shown in FIGS. 7A, 7B and 7C may be prepared. The image is once enlarged by utilizing the tables of FIGS. 7A, 7B and 7C and after that the brightness conversion operation is thereafter carried out by utilizing the table shown in FIGS. 2A, 2B and 2C.

Namely, according to the tables of FIGS. 7A, 7B and 7C, only in a case where all the brightness of the pixels ① to ⑨ are made [0], the brightness of the pixel ① is made [0], and in other cases, the brightness of the pixel ① is made [1]. The brightness conversion operation of FIGS. 7A, 7B and 7C is reverse to the brightness conversion operation of FIGS. 2A, 2B and 2C.

According to the manner described above, the area A having the brightness [0] shown in FIG. 6 is amended to [1] to thereby prevent the influence of the noise, for example, thus being capable of performing correct treatment thereafter. In this case, although the area of the contour portion having the brightness [1] is increased, this problem can be solved by considering the extra number of times of the brightness conversion operations.

Further, an image constituted by a pixel having the brightness [1] just before the extinction such as shown in FIG. 5 is converged to the central portion of the bonding ball 4, so that the center of this image can be deemed as the central portion of the bonded portion at a time when the position of the bonded portion is measured, whereby the position of the bonded portion can be easily inspected at the same time as the inspection of the quality of the bonded portion.

According to the present embodiments, the inspections of the quality and the position of the bonded portion can be made possible during the same procedure irrespective of the extending direction of the bonding wire 3 and the irregular shape of the contour of the extracted pixel of the bonding ball 4 (bonded portion), resulting in a shortage of the inspection time and the improvement of the inspection performance, and, hence, the inspection device is itself made compact.

In the described embodiment, for the determination of the brightness of a certain pixel, in combination of nine pixels including this one central pixel and other eight pixels surrounding the same, the new brightness of the central pixel is determined, but in a modification, the brightness of the central pixel may be determined by the combination of the central pixel and other four pixels positioned upper and lower and left and right portions of the central pixels.

What is claimed is:

1. A method of inspecting a joint portion of one member which is plastically deformed and jointed to another member by utilizing an image pickup device, comprising the steps of:

image picking up the jointed portion plastically deformed;

extracting the jointed portion as a mass of pixels each having predetermined brightness from an image picked up by the image pickup device;

decreasing a size of the mass of the extracted pixels by carrying out, by at least one step, logical brightness conversion operation on the basis of the relationship in brightness of one of the pixels with respect to other pixels which surround the one of the pixels;

repeating the brightness conversion operation till the mass of the extracted pixels is extinguished; and detecting a size of the jointed portion in dependency on the number of times of the brightness conversion operations carried out till the mass of the pixels is extinguished to thereby evaluate the quality of the jointed portion.

2. The inspection method according to claim 1, wherein the brightnesses of the pixels are represented by binarized values.

3. The inspection method according to claim 1, wherein the logical brightness conversion operation is carried out by logical filtering operation.

4. The inspection method according to claim 1, wherein the evaluation of the quality of the jointed portion is made in accordance with a preliminarily determined allowable reference number of times of the brightness conversion operations.

5. The inspection method according to claim 1, wherein the joint portion of one member is bonded to another member.

6. The inspection method according to claim 5, wherein one member is a bonding wire and another member is a semiconductor chip.

7. The inspection method according to claim 1, wherein the method further comprises a step of temporarily increasing the size of the mass of the pixels, before the decreasing step of the size of the mass of the pixels, by a reverse logical brightness conversion operation to that of the decreasing step.

8. A method of inspecting a joint portion of one member which is plastically deformed and jointed to another member by utilizing an image pickup device, comprising the steps of:

image picking up the jointed portion plastically deformed;

extracting the jointed portion as a mass of pixels each having predetermined brightness from an image picked up by the image pickup device;

decreasing a size of the mass of the extracted pixels by carrying out, by at least one step, logical brightness conversion operation on the basis of the relationship in brightness of one of the pixels with respect to other pixels which surround the one of the pixels;

repeating the brightness conversion operation till the mass of the extracted pixels is extinguished; and detecting a center of the mass of the pixels as a center of the jointed portion just before a time when the mass thereof is extinguished to thereby inspect a position of the jointed portion.

9. The inspection method according to claim 8, wherein the brightnesses of the pixels are represented by binarized values.

10. The inspection method according to claim 8, wherein the logical brightness conversion operation is carried out by logical filtering operation.

11. The inspection method according to claim 8, wherein the joint portion of one member is bonded to another member.

12. The inspection method according to claim 11, wherein one member is a bonding wire and another member is a semiconductor chip.

13. The inspection method according to claim 8, wherein the method further comprises a step of temporarily increasing the size of the mass of the pixels, before the decreasing step of the size of the mass of the pixels, by a reverse logical brightness conversion operation to that of the decreasing step.

14. A method of inspecting a joint portion of one member which is plastically deformed and jointed to another member by utilizing an image pickup device, comprising the steps of:

image picking up the jointed portion plastically deformed;

extracting the jointed portion as a mass of pixels each having predetermined brightness from an image picked up by the image pickup device;

decreasing a size of the mass of the extracted pixels by carrying out, by at least one step, logical brightness conversion operation on the basis of the relationship in brightness of one of the pixels with respect to other pixels which surround the one of the pixels;

repeating the brightness conversion operation till the mass of the extracted pixels is extinguished;

detecting a size of the jointed portion in dependency on the number of times of the brightness conversion operations carried out till the mass of the pixels is extinguished to thereby evaluate the quality of the jointed portion; and detecting a center of the mass of the pixels as a center of the jointed portion just before a time when the mass thereof is extinguished to thereby inspect a position of the jointed portion.

* * * * *